United States Patent [19]

Johnson et al.

[11] 4,267,559
[45] May 12, 1981

[54] LOW THERMAL IMPEDANCE LIGHT-EMITTING DIODE PACKAGE

[75] Inventors: Bertrand H. Johnson, New Providence; Carl R. Paola, Westfield, both of N.J.

[73] Assignee: Bell Telephone Laboratories, Incorporated, Murray Hill, N.J.

[21] Appl. No.: 77,988

[22] Filed: Sep. 24, 1979

[51] Int. Cl.³ .............................................. H01L 23/02
[52] U.S. Cl. ....................................... 357/81; 357/17; 357/72
[58] Field of Search ........................ 357/17, 18, 81, 72

[56] References Cited

U.S. PATENT DOCUMENTS

| | | | |
|---|---|---|---|
| 3,299,331 | 1/1967 | Lacey | 317/235 |
| 3,458,779 | 7/1969 | Blank | 317/234 |
| 3,510,732 | 5/1970 | Amans | 317/234 |
| 3,614,550 | 10/1971 | Marinace | 317/234 R |
| 3,805,347 | 4/1974 | Collins et al. | 29/25.13 |
| 3,867,666 | 2/1975 | Nyul | 313/500 |
| 4,003,074 | 1/1977 | Yonezu | 357/74 |
| 4,032,963 | 6/1977 | Thome | 357/72 |
| 4,131,911 | 12/1978 | Fujine | 357/74 |

Primary Examiner—Martin H. Edlow
Attorney, Agent, or Firm—Peter V. D. Wilde

[57] ABSTRACT

Disclosed is an assembly for relatively high power light-emitting semiconductor devices that uses simple inexpensive components and construction to provide a heat coupler that reduces the thermal impedance between the active device and the ambient atmosphere by approximately a factor of ten from that of a comparable assembly not incorporating the inventive heat coupler. The active semiconductor device is directly mounted on the heat coupler. The coupler is fabricated from material having good thermal conductivity, such as copper, copper alloys, or aluminum, and is designed to have a large surface area, at least ten times the area of the bonding surface of the active device, in unobstructed contact with the ambient atmosphere, thereby providing efficient heat coupling between the heat source and the ultimate heat sink.

13 Claims, 1 Drawing Figure

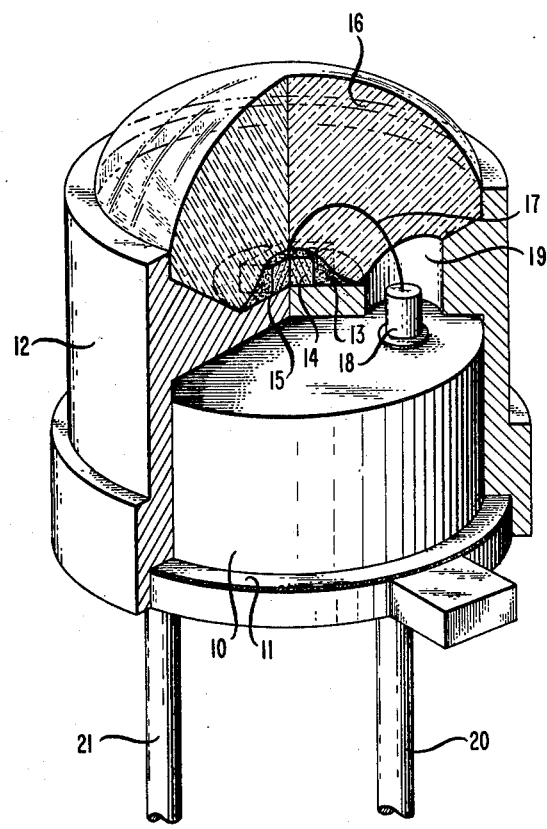

LOW THERMAL IMPEDANCE LIGHT-EMITTING DIODE PACKAGE

BACKGROUND OF THE INVENTION

The invention relates to semiconductor optoelectronic devices, more particularly, to relatively high power light-emitting devices.

PRIOR ART

Semiconductor light-emitting devices, such as light-emitting diodes (LED), have been known for some time. Typically, they consist of an active device, the chip, mounted on a platform, often referred to as the "header." This assembly is often encapsulated directly by a transparent substance, such as is shown for instance in U.S. Pat. No. 3,510,732, or by a "can" that might be placed over the chip and is attached to the header, thereby protecting the active device. An example of this latter arrangement can for instance be found in U.S. Pat. No. 3,458,779. These arrangements, as well as similar ones, have proven to be quite satisfactory for use in low power light-emitting devices, i.e., devices in which no particular precautions have to be taken for dissipating the thermal energy produced in the chip.

In the field of semiconductor power diodes or transistors the need for efficient heat dissipation has resulted in a variety of device assemblies, an example of which can be found in U.S. Pat. No. 3,229,331. That patent discloses an assembly in which the header forms part of the exterior surface of the assembly, thereby facilitating thermal coupling to the ambient atmosphere. With the advent of light-emitting devices operating at somewhat higher power levels the need for improved thermal coupling of the device to a heat sink became acute also in the opto-electronic field, since without efficient heat removal the temperature of the active device would rise to an unacceptable level, resulting in degraded performance or failure of the device.

SUMMARY OF THE INVENTION

The inventive light-emitting diode assembly provides for improved thermal coupling between the source of thermal energy, the light-emitting chip, and the ultimate sink for this thermal energy, the ambient atmosphere. This improvement is achieved using only standard, and easily manufactured and cheap nonstandard, parts. It provides a convenient and inexpensive solution to the problem of maintaining the active device at an acceptable temperature while operating the device at relatively high power levels. For instance, a particular embodiment of the invention offers an order-of-magnitude reduction of the thermal impedance over comparable prior art devices, if coupled to an infinite heat sink, where by an "infinite" heat sink we merely mean one that has a thermal impedance that is small compared to that of the light-emitting assembly, of the order of 1/10 or less. The novel aspect of the inventive assembly is the mounting of the active device on a component of the assembly that is a good thermal conductor, and forms a substantial fraction of the total external surface of the structure. This results in quite efficient heat transfer from the assembly directly to the surrounding air, which can be further improved, if necessary, by the attaching of standard dissipating structure to the heat coupling surface of the assembly.

BRIEF DESCRIPTION OF THE DRAWING

The drawing is a schematic representation, in a partial cutaway view, of a particular embodiment of the invention.

DETAILED DESCRIPTION

In the sequel, we mean by "light-emitting semiconductor devices" or equivalent terms, devices whose useful output of electromagnetic energy lies in the visible region of the spectrum or in adjacent regions of the spectrum. Similarly, "light" can refer to electromagnetic energy in either the visible part of the spectrum or the adjacent regions. By "good" thermal or electrical conductivity, we mean conductivity greater than the respective conductivities of KOVAR, which has a thermal conductivity of approximately 0.17 watts cm/cm$^2$·°C., and an electrical conductivity of approximately $2.0 \cdot 10^4 \Omega^{-1} \cdot cm^{-1}$, both referring to approximately room temperature. By "external coupling surface" of the coupler we mean that portion of the external surface of the coupler that is adapted to being placed in contact with heat-dissipating means, where by "heat-dissipating means" we mean both the ambient atmosphere as well as separate dissipating structures, such as collars or fins. And lastly, by "unconstrained surface" of an epoxy structure we mean a free surface, i.e., one not in contact with other solid surfaces.

As with all semiconductor junction devices, the performance of LEDs and the like is degraded by a rise in the device temperature. The temperature of the chip, and, in particular, the junction temperature, affects the quantum efficiency of the conversion process from electrical to radiant energy, and thus affects the emitted radiant power of the device. With rising temperature the quantum efficiency and radiant power decrease. As an example, for GaAs diodes the radiant power is decreased approximately by a factor of ½ with a temperature rise from about 20 degrees C. to 100 degrees C. See, for instance, Texas Instruments Electronics Series, *Optoelectronics: Theory and Practice*, Alan Chappell, ed., McGraw-Hill, (1978) page 221. In addition to this loss in efficiency with increasing temperature, there is an upward shift in the wavelength of the emitted light, in particular, an increase of the wavelength of maximum power by about 3.5 Å/°C. Such a change obviously would have undesirable consequences in a device that is part of a communication system that is optimized for operation at a particular wavelength.

From the above, it is obvious that it is necessary to maintain the junction temperature of light-emitting devices as nearly as possible at a temperature near ambient temperature. Since LEDs and similar devices are generally simple and inexpensive structures that are used in great numbers, and probably will be even more frequently used in the future, it is clearly very desirable to solve the problem of heat dissipation in a manner that will add little cost to that of the basic device.

The inventive assembly, which provides for very efficient thermal coupling of the active device, the source of thermal energy, with the ambient atmosphere, is of very simple construction, and uses only simple and inexpensive components. It also lends itself to the attaching of dissipating structures, should the need therefore arise. The assembly is also well adapted to actively cooling the device, such as, for instance, by thermoelectric cooling, as opposed to merely passively maintaining the device near but above ambient temperature.

A particular embodiment of the inventive assembly is shown in FIG. 1. The drawing shows header 10, which, in this case, is a standard, very inexpensive, commercially available part that carries the industry designation TO-18. It is compatible with other semiconductor hardware, is of very rugged construction and enjoys complete acceptance by the industry. However, its construction would make it a poor thermal path between the active device and the dissipating means, were the chip mounted directly on the header, and thus it would not form a good mounting base for a chip that generates an appreciable amount of heat. This is because the TO-18 header is constructed principally of glass and KOVAR, materials which are very poor thermal conductors. The heat coupler 12 fits over the header 10, and is attached thereto by, for instance, conductive epoxy bonding or soldering, as is indicated in the drawing by the layer 11. Since the principal functions of this bonding layer are the provision of adhesion and electrical contact between heat coupler and header a large group of materials is potentially available for this function. The heat coupler 12 consists of a metal of high thermal conductivity, such as copper, copper alloys, aluminum, or the like. The details of shape of the heat coupler are not critical, as long as the active device 14 can be mounted directly on the heat coupler, in a way that adds minimal thermal and electrical resistance to the heat conductive path from the junction to the ambient atmosphere and to the electrically conductive path from the junction to lead 21, respectively, and as long as the coupler has a coupling surface that is as large as practicable. Although the specifics of any assembly will be determined by the function for which it is designed, we find that a useful criterion for the design of an efficient coupler is the ratio of the area of the bonding surface of the active device to the area of the external coupling surface of the coupler, since heat transfer across an interface takes place at both these surfaces. The ratio should be as small as possible, with 0.1 probably being an upper limit for an efficient design. An added desirable feature of the coupler, of course, is simplicity of shape, to facilitate manufacture of the part at low cost. In the preferred embodiment, the surface 15 of the heat coupler is gold-plated to insure reliable thermal and electrical contact between the active device and the coupler. An epoxy-conformal coating 13 is interposed between the active device and epoxy lens 16. The function of this coating is the provision of a pliable layer between the relatively rigid epoxy lens 16 and the active device 14, in order to avoid subjecting the active device to undesirable stresses. A material often used for this purpose is HYSOL 902 epoxy. The second electrical contact with the active device that is required for a diode is provided by wire bond 17 that leads from the appropriate surface of the diode to post 18, through aperture 19 in the heat coupler. It will be obvious that electrical contact between wire 17 and heat coupler 12 has to be prevented. The post 18 is insulated from both heat coupler 12 and header 10, but is in electrical contact with external contact pin 20. Lead 21 is in electrical contact with both header and heat coupler.

It will be obvious to those skilled in the art that the preferred embodiment as described above is not the only possible embodiment of the inventive idea. Instead, this idea if readily adaptable to a variety of special situations that might require different headers, or perhaps different optical coupling by means of a different lens arrangement. Similarly, it would be an obvious step to improve the thermal coupling provided by the inventive assembly by adding well-known heat dissipating structures, such as ribs or fins, to the outer surface of the heat coupler. Furthermore, the invention can be applied to cooling opto-electronic devices other than LEDs, such as, for instance, solid state lasers.

Measurements were made on an infrared-emitting diode (IRED) assembly that incorporated the above described features of the preferred embodiment. It was found that this structure, when coupled to an infinite heat sink, had a thermal impedance of 15° to 25° C./watt. This is to be contrasted with results obtained from a similar structure not containing the heat coupler, i.e., one in which the chip is directly mounted on the TO-18 header, and the assembly then encapsulated in a can. In this latter case, it was found that, for the same experimental conditions, the thermal impedance was from 150°–300° C./watt, that is, the incorporation of the heat coupler resulted in a reduction of the impedance by a factor of approximately 10. It is obvious that this reduction in the thermal impedance of the structure implies a significant increase in the obtainable luminous output of the device.

We claim:

1. A light-emitting semiconductor assembly comprising
   (a) a header;
   (b) a heat coupler composed of material having a room-temperature electrical conductivity greater than $2.0 \cdot 10^4 \Omega^{-1} \cdot cm^{-1}$, and a room-temperature thermal conductivity greater than 0.17 watts cm/cm$^2 \cdot$°C., the coupler having at least an external coupling surface adapted to contacting heat-dissipating means, an upper surface, and a lower surface, the header being bonded to the heat coupler at the lower surface;
   (c) a light-emitting semiconductor device, having a bonding surface of area not larger than 1/10 of the area of the external coupling surface of the coupler, being bonded at the bonding surface in thermally and electrically conducting relationship to the heat coupler; and
   (d) light transmitting means covering the light-emitting device, adapted to transmit light from the device.

2. An assembly according to claim 1 wherein the light-transmitting means comprise an epoxy structure having at least one unconstrained surface.

3. An assembly according to claim 2 wherein the epoxy structure substantially covers the upper surface of the heat coupler and the light-emitting device.

4. An assembly according to claim 3 wherein an epoxy-conformal layer is interposed between the epoxy structure and the light-emitting device.

5. A light-emitting diode assembly comprising
   (a) a header;
   (b) a heat coupler composed of material having a room temperature electrical conductivity greater than $2.0 \cdot 10^4 \Omega^{-1} \cdot cm^{-1}$, and a room temperature thermal conductivity greater than 0.17 watts·cm/cm$^2 \cdot$°C., the coupler having at least an external coupling surface adapted to contacting heat-dissipating means, an upper surface, and a lower surface, the header being bonded to the heat coupler at the lower surface;
   (c) a light-emitting semiconductor diode, having a bonding surface of area not larger than 1/10 of the area of the external coupling surface of the coupler, the diode being bonded at the bonding surface in electrically and thermally conducting relationship to the heat coupler; and (d) light-transmitting means covering the light-emitting diode, adapted to transmitting light from the light-emitting diode.

6. An assembly according to claim 5 wherein the light-transmitting means comprise an epoxy structure having at least one unconstrained surface.

7. An assembly according to claim 6 wherein the epoxy structure substantially covers the upper surface of the heat coupler and the light-emitting diode.

8. An assembly according to claim 7 wherein an epoxy-conformal layer is interposed between the epoxy structure and the light-emitting diode.

9. An assembly according to claim 5 wherein the header is a TO-18 header.

10. An assembly according to claim 9 wherein the heat coupler comprises a copper alloy.

11. An assembly according to claim 10 wherein the light-transmitting means consists substantially of epoxy substantially covering the upper surface of the heat coupler and the diode, the light-transmitting means having an unconstrained surface.

12. A light-emitting semiconductor diode assembly comprising
(a) a TO-18 header;
(b) a heat coupler comprising a copper alloy, the coupler having substantially cylindrical shape, with an upper and a lower surface, and a peripheral coupling surface, the header being bonded to the coupler at the lower surface of the coupler;
(c) a light-emitting semiconductor diode chip, having a bonding surface of area not larger than 1/10 of the area of the peripheral coupling surface of the coupler, the diode being bonded at the bonding surface in electrically and thermally conducting relationship to the upper surface of the heat coupler;
(d) an epoxy structure adapted to transmitting light from the diode chip, substantially covering the upper surface of the heat coupler and the diode chip, and having an unconstrained surface; and
(e) an epoxy-conformal layer interposed between the epoxy structure and the diode chip.

13. An assembly according to claims 1, 5 or 12 wherein the lower surface of the heat coupler has an indented portion, with the indented portion fitting over at least part of the header.

* * * * *